US 7,970,035 B2
Jun. 28, 2011

(12) United States Patent
Kawaguchi et al.

(54) NITRIDE SEMICONDUCTOR LASER ELEMENT AND EXTERNAL-CAVITY SEMICONDUCTOR LASER DEVICE

(75) Inventors: Yoshinobu Kawaguchi, Nara (JP); Takeshi Kamikawa, Tenri (JP)

(73) Assignee: Sharp Kabushiki Kaisha, Osaka (JP)

( * ) Notice: Subject to any disclaimer, the term of this patent is extended or adjusted under 35 U.S.C. 154(b) by 0 days.

(21) Appl. No.: 12/406,533

(22) Filed: Mar. 18, 2009

(65) Prior Publication Data

US 2009/0238229 A1  Sep. 24, 2009

(30) Foreign Application Priority Data

Mar. 19, 2008 (JP) .................................. 2008-072029

(51) Int. Cl.
*H01S 5/00* (2006.01)
*H01S 3/08* (2006.01)
(52) U.S. Cl. ...................... 372/49.01; 372/102; 372/108
(58) Field of Classification Search ............... 372/49.01, 372/102, 29.021, 108
See application file for complete search history.

(56) References Cited

U.S. PATENT DOCUMENTS

| 6,343,088 B1* | 1/2002 | Mugino et al. ............. 372/49.01 |
| 7,065,118 B2* | 6/2006 | Tojo et al. .................. 372/49.01 |
| 7,697,585 B2* | 4/2010 | Sogabe et al. ............. 372/49.01 |
| 2007/0205424 A1 | 9/2007 | Kamikawa et al. |
| 2009/0075413 A1 | 3/2009 | Kamikawa et al. |
| 2009/0159923 A1 | 6/2009 | Kamikawa et al. |

FOREIGN PATENT DOCUMENTS

| JP | 2005-167008 A | 6/2005 |
| JP | 2005-340625 A | 12/2005 |
| JP | 2006-40843 | 2/2006 |
| JP | 2006-267554 A | 10/2006 |
| JP | 2007-189201 A | 7/2007 |
| JP | 2007-273951 | 10/2007 |

* cited by examiner

*Primary Examiner* — Armando Rodriguez
(74) *Attorney, Agent, or Firm* — Birch, Stewart, Kolasch & Birch, LLP (57) ABSTRACT

Disclosed are a nitride semiconductor laser element including a light emitting portion made of a nitride semiconductor, and an external-cavity semiconductor laser device using it. In the nitride semiconductor laser element, a coat film made of silicon oxynitride is formed on the light emitting portion, and the reflectance of the coat film to feedback light of laser light emitted from the light emitting portion is 0.5% or less.

6 Claims, 6 Drawing Sheets

FIG.8

NITRIDE SEMICONDUCTOR LASER ELEMENT AND EXTERNAL-CAVITY SEMICONDUCTOR LASER DEVICE

This nonprovisional application is based on Japanese Patent Application No. 2008-072029 filed on Mar. 19, 2008 with the Japan Patent Office, the entire contents of which are hereby incorporated by reference.

BACKGROUND OF THE INVENTION

1. Field of the Invention

The present invention relates to a nitride semiconductor laser element and an external-cavity semiconductor laser device (hereinafter, referred to as an "ECL device"), and more particularly to a nitride semiconductor laser element that allows a nitride semiconductor laser element having a large output and a low reflectance of a light receiving surface to feedback light to be produced with high yields, and an ECL device using the nitride semiconductor laser element.

2. Description of the Background Art

Holographic memory technology, which is mass-capacity and very high speed data storage technology, is expected as a next generation optical memory. Researches and development toward its practical use are energetically carried out. Laser light having coherence is used for data read/write of holographic memories. Among devices using laser light, semiconductor laser elements permit significant size reduction of devices, and therefore researches and development for the use of semiconductor laser elements are in progress.

Recently, nitride semiconductor laser elements that emit blue-violet laser light having a wavelength of about 405 nm have been widely used as light sources for optical discs, such as HD-DVDs (High-Definition Digital Versatile Discs) and Blu-ray discs, having memory capacities larger than those of hitherto DVDs.

Attempts to use nitride semiconductor laser elements as light sources of holographic memories are also made. However, as different from optical discs, such as HD-DVDs and Blu-ray discs, single longitudinal mode oscillation is indispensable for a light source of a holographic memory that carries out read and write of data by making use of interference. Further, in order to perform recording and reconstructing with high repeatability when a recording medium expands and contracts because of environmental temperature and the intensity of the emission of a light source, the wavelength of a beam emitted from a light source needs to be varied (e.g., see Japanese Patent Laying-Open No. 2006-267554).

Ordinary semiconductor laser elements cannot achieve such a single longitudinal mode and wavelength varying, and therefore a DFB (Distributed Feedback) semiconductor laser element or an ECL device needs to be used. An ECL device is often used as a light source of a holographic memory because it can be relatively easily produced as compared to a DFB semiconductor laser element.

Characteristics required of an ECL device are that its output is large and its single longitudinal mode characteristic is good. To increase the output of the ECL device, a semiconductor laser element serving as a light source of the ECL device is also required to have a large output as its characteristic. For example, Japanese Patent Laying-Open No. 2005-167008 describes that an ECL device needs to have an output of 30 mW or higher, and in order to obtain this output, a semiconductor laser element needs to have an output of 45 mW or higher (see paragraph [0041] and so on of Japanese Patent Laying-Open No. 2005-167008).

To obtain a good single longitudinal mode characteristic in an ECL device, increasing the quantity of feedback light is effective in general. One of techniques for accomplishing this is to reduce the reflectance of a light receiving surface of a semiconductor laser element serving as a light source of an ECL device. Note that Japanese Patent Laying-Open No. 2005-167008 describes that by setting the reflectance of a light receiving surface of a semiconductor laser element to feedback light to the range from 0% to 10%, a single longitudinal mode laser beam can be accomplished, and in particular, it is preferred that the reflectance be 3% or less (see paragraph [0050] and so on of Japanese Patent Laying-Open No. 2005-167008).

SUMMARY OF THE INVENTION

As described above, when a nitride semiconductor laser element serves as a light source of an ECL device, it is preferable to use one with the largest possible output and with the lowest possible reflectance of a light receiving surface to feedback light.

However, when the reflectance of a light receiving surface to feedback light is decreased too much in a nitride semiconductor laser element serving as a light source of an ECL device described in Japanese Patent Laying-Open No. 2005-167008, there is a risk of decreasing yields of a coat film constituting the light receiving surface (see paragraph [0050] and so on of Japanese Patent Laying-Open No. 2005-167008).

A coat film for improving the output of a nitride semiconductor laser element is not necessarily identical in configuration to a coat film for reducing the reflectance of a light receiving surface to feedback light.

In view of the above circumstances, an object of the present invention is to provide a nitride semiconductor laser element that allows a nitride semiconductor laser element having a large output and a low reflectance of a light receiving surface to feedback light to be produced with high yields, and an ECL device using the nitride semiconductor laser element.

The present invention relates to a nitride semiconductor laser element including a light emitting portion made of a nitride semiconductor, wherein a coat film made of silicon oxynitride is formed on the light emitting portion, and a reflectance of the coat film to feedback light of laser light emitted from the light emitting portion is 0.5% or less.

Here, in the nitride semiconductor laser element of the present invention, a nitrogen content in the coat film is preferably 3 atomic % or more and 20 atomic % or less.

In the nitride semiconductor laser element of the present invention, an interlayer made of aluminum oxynitride may be formed between the light emitting portion and the coat film.

In the nitride semiconductor laser element of the present invention, an oxygen content in the interlayer is preferably 5 atomic % or more and 35 atomic % or less.

In the nitride semiconductor laser element of the present invention, the reflectance is preferably 0.1% or less.

In the nitride semiconductor laser element of the present invention, a nitrogen content in the coat film is preferably 10 atomic % or more and 15 atomic % or less.

In the nitride semiconductor laser element of the present invention, a wavelength of the feedback light is preferably 400 nm or more and 420 nm or less.

The present invention also relates to an external-cavity semiconductor laser device including: any of the nitride semiconductor laser element described above; and a diffraction grating for returning at least part of the laser light emitted from the nitride semiconductor laser element to the nitride semiconductor laser element.

According to the present invention, it is possible to provide a nitride semiconductor laser element that allows a nitride semiconductor laser element having a large output and a low reflectance of a light receiving surface to feedback light to be produced with high yields, and an ECL device using the nitride semiconductor laser element.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Embodiments of the present invention will now be described. Note that in the drawings of the present invention, the same reference characters represent the same or corresponding parts.

Figure 1:
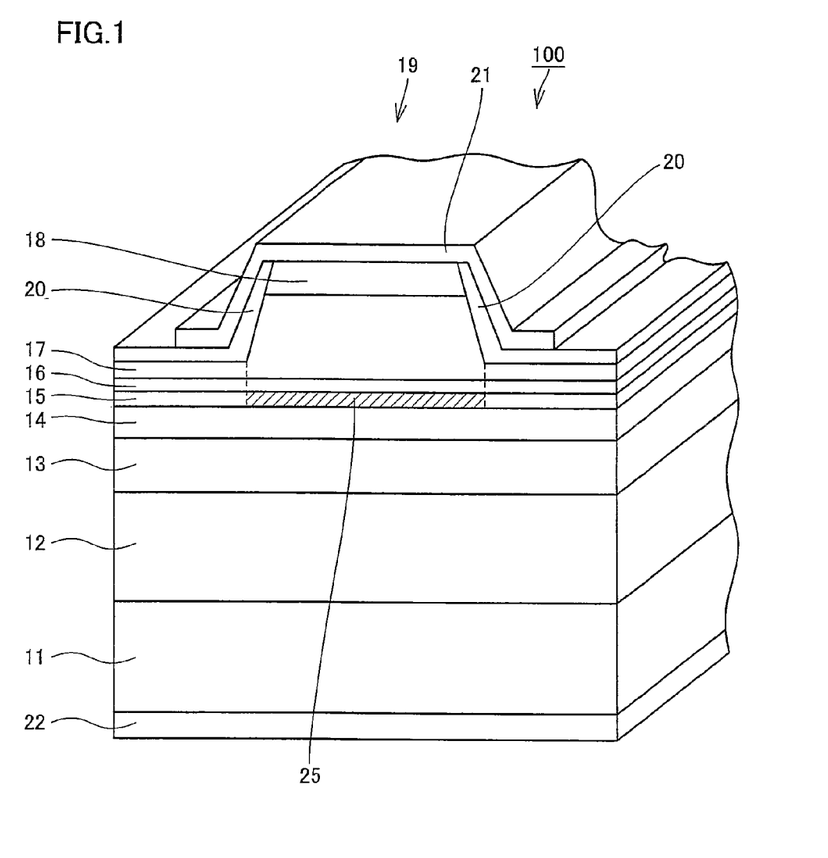
FIG. 1 shows a schematic perspective view of a nitride semiconductor laser element in accordance with an embodiment of the present invention.

FIG. 1 shows a schematic perspective view of a nitride semiconductor laser element in accordance with an embodiment of the present invention.

Here, a nitride semiconductor laser element 100 shown in FIG. 1 has a multilayered structure in which on a conductive substrate 11, an n-type nitride semiconductor buffer layer 12, an n-type nitride semiconductor clad layer 13, an n-type nitride semiconductor guide layer 14, a nitride semiconductor active layer 15, a p-type nitride semiconductor guide layer 16, a p-type nitride semiconductor clad layer 17 and a p-type nitride semiconductor contact layer 18 are sequentially stacked in this order from the side of conductive substrate 11.

For the purpose of light trapping in a horizontal direction of laser light emitted from nitride semiconductor laser element 100, part of p-type nitride semiconductor clad layer 17 and part of p-type nitride semiconductor contact layer 18 are removed in a stripe shape to provide a ridge stripe structure having a ridge stripe portion 19 structured such that part of p-type nitride semiconductor clad layer 17 projects upward. To inject current only into ridge stripe portion 19, insulating films 20 are formed on both sides of ridge stripe portion 19. As insulating films 20, for example, silicon oxide, zirconium oxide or the like may be used.

Further, as electrodes for injecting current into nitride semiconductor laser element 100, an n-electrode 22 is formed on the back surface of conductive substrate 11, and a p-electrode 21 is formed on the front surface of p-type nitride semiconductor contact layer 18.

In FIG. 1, a cavity end face 25 exists on a light emission side that is formed by cleaving after the foregoing layers are formed on conductive substrate 11. In the present invention, a light emission portion means a portion where laser light is emitted from a nitride semiconductor laser element. In this example, cavity end face 25 on the light emission side corresponds to the light emission portion. Note that cavity end face 25 on the light emission side is a cavity end face of nitride semiconductor active layer 15 positioned below ridge stripe portion 19.

It should be noted that the kinds of nitride semiconductors constituting the foregoing layers, the mixed crystal ratio, the thicknesses, the number of stacked layers and the order of stacking layers are not limited to those mentioned above, and may be appropriately determined. In the present invention, as a nitride semiconductor, for example, a compound of at least one kind of III group element selected from a group consisting of Al (aluminum), Ga (gallium) and In (indium) and N (nitrogen) being a V group element may be used.

In the present invention, as a p-type nitride semiconductor, for example, the foregoing nitride semiconductor doped with a p-type dopant, such as boron, may be used. In the present invention, as an n-type nitride semiconductor, for example, the foregoing nitride semiconductor doped with an n-type dopant, such as phosphorus, may be used.

The wavelength of feedback light of laser light emitted from nitride semiconductor laser element 100 of the present invention (light that is once emitted from nitride semiconductor laser element 100 and thereafter is returned to nitride semiconductor laser element 100, for example, by diffraction of a diffraction grating) is within the range from 400 nm (inclusive) to 420 nm (inclusive).

Figure 2:
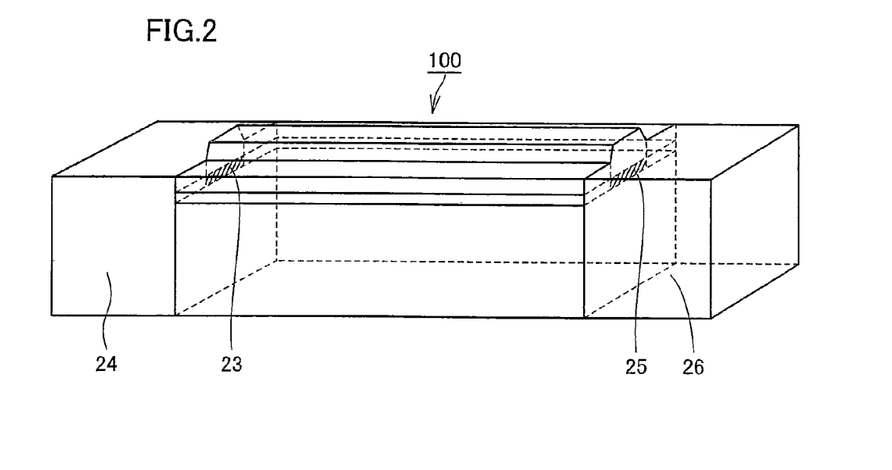
FIG. 2 is a schematic perspective view of the nitride semiconductor laser element in accordance with the embodiment of the present invention.

FIG. 2 is a schematic perspective view of nitride semiconductor laser element 100 shown in FIG. 1. Here, as shown in FIG. 2, nitride semiconductor laser element 100 has cavity end face 25 on the light emission side serving as the main surface of emission of laser light and a cavity end face 23 on a light reflection side serving as the main surface of reflection of laser light.

A coat film 26 made of silicon oxynitride is formed on the surface of cavity end face 25 on the light emission side. On the other hand, a high reflection film 24 for increasing the reflectance for a beam of laser light (hereinafter referred to also as a "laser beam") on the light reflection side of nitride semiconductor laser element 100 is formed on the surface of cavity end face 23 on the light reflection side.

Here, in the present invention, it is one of features that the reflectance for feedback light of laser light emitted from the light emitting portion is 0.5% or less on the surface of coat film 26. With such a structure, when nitride semiconductor laser element 100 is used as a light source of an ECL device, the reflectance of coat film 26 serving as a light receiving surface of nitride semiconductor laser element 100 to the feedback light of laser light can be reduced to 0.5% or less, so that the reflectance is low. This reduction allows the quantity of feedback light of laser light to be increased, achieving a very good single longitudinal mode characteristic of nitride semiconductor laser element 100.

In the present invention, it is one of features that coat film 26 made of silicon oxynitride is used so that the reflectance for feedback light of laser light is 0.5% or less. With such a structure, the reflectance of coat film 26 can be easily controlled by adjusting the nitrogen content of silicon oxynitride constituting coat film 26. The decrease in yield of nitride semiconductor laser element 100 can thus be effectively suppressed.

Figure 3:
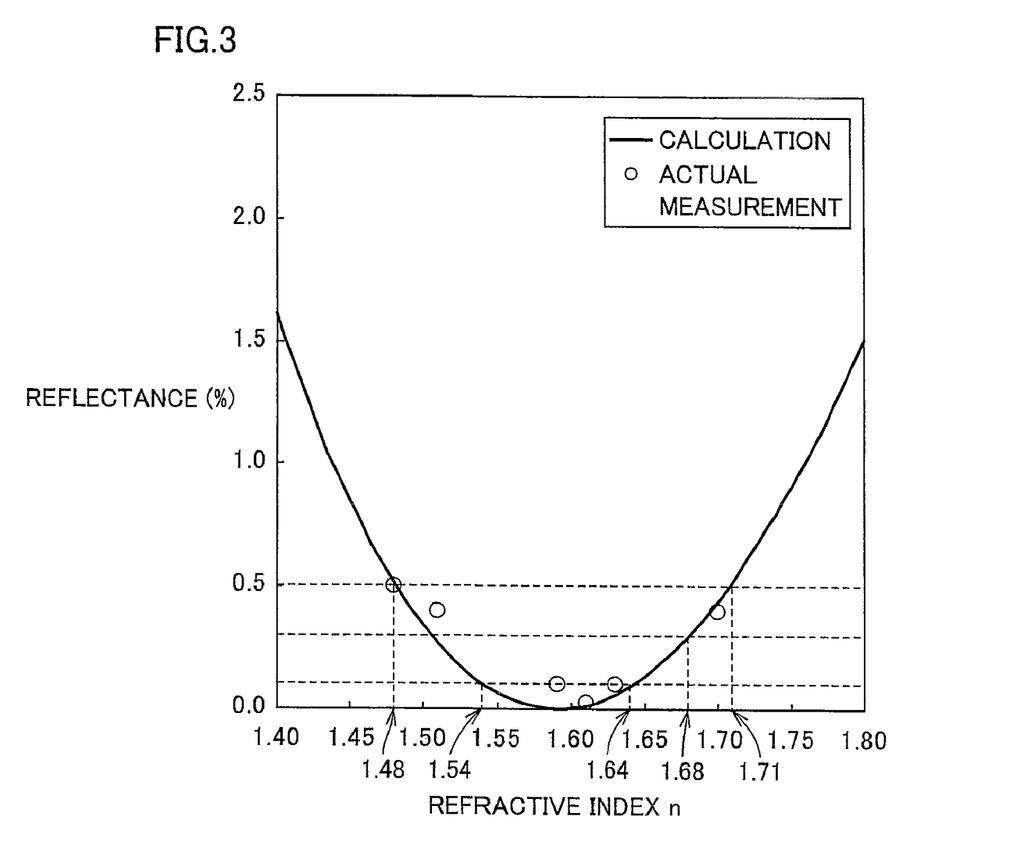
FIG. 3 shows a relationship between a refractive index n and a reflectance (%) of a coat film made of silicon oxynitride.

FIG. 3 shows a relationship between a refractive index n and a reflectance (%) of coat film 26 made of silicon oxynitride. In FIG. 3, the horizontal axis represents the refractive index n of coat film 26 made of silicon oxynitride, and the vertical axis represents the reflectance (%) of coat film 26. In FIG. 3, the reflectance of coat film 26 to a laser beam having a wavelength of 405 nm is plotted when the thickness of coat film 26 is set to 405/4/n. Also in FIG. 3, the relationship between the refractive index n and the reflectance (%) of coat film 26 made of silicon oxynitride is obtained both by calculation and by actual measurement.

Note that upon forming coat film 26 having the refractive index n on a transparent body having the refractive index $n_s$, when a film thickness d of coat film 26 is $\lambda/(4n)$, a graph of calculation in FIG. 3 is obtained from an expression of the minimum reflectance of $(n^2-n_s)^2/(n^2+n_s)^2$, where $n_s=2.53$.

Actually measured data in FIG. 3 is obtained according to the above, with the refractive index n of coat film 26 being varied by changing the amount of oxygen of silicon oxynitride so as to actually minimize the reflectance. Assuming that the film thickness d of coat film 26 is $\lambda/(4n)$, the reflectance upon forming coat film 26 on a cavity end face of nitride semiconductor laser element is plotted on the above calculation graph.

As shown in FIG. 3, it is found that in order that the reflectance of coat film 26 to a laser beam having a wavelength of 405 nm is 0.5% or less, the refractive index n of coat film 26 made of silicon oxynitride needs to be set within a range from 1.48 (inclusive) to 1.71 (inclusive).

Examples of a material having a refractive index within the range from 1.48 (inclusive) to 1.71 (inclusive) include silicon oxide ($SiO_2$) having a refractive index of about 1.48 and aluminum oxide ($Al_2O_3$) having a refractive index of about 1.68. However, in the case of using silicon oxide or aluminum oxide instead of silicon oxynitride, the reflectance can be reduced to 0.5% or less, but controlling the refractive index is not easy. In this case, there is therefore a drawback in that yields of the nitride semiconductor laser element decrease.

That is, values of refractive indexes of silicon oxide and aluminum oxide are mentioned in the above, but refractive indexes can vary according to film formation conditions. Each value of refractive indexes of silicon oxide and aluminum oxide is relatively close to a boundary value in the range from 1.48 (inclusive) to 1.71 (inclusive). Accordingly, in the case of forming a coat film by using silicon oxide or aluminum oxide, when the refractive index of the coat film varies by some factor, such as film formation conditions, the refractive index is often beyond the above range of the refractive index. This causes a decrease in yields of the nitride semiconductor laser element.

Figure 4:
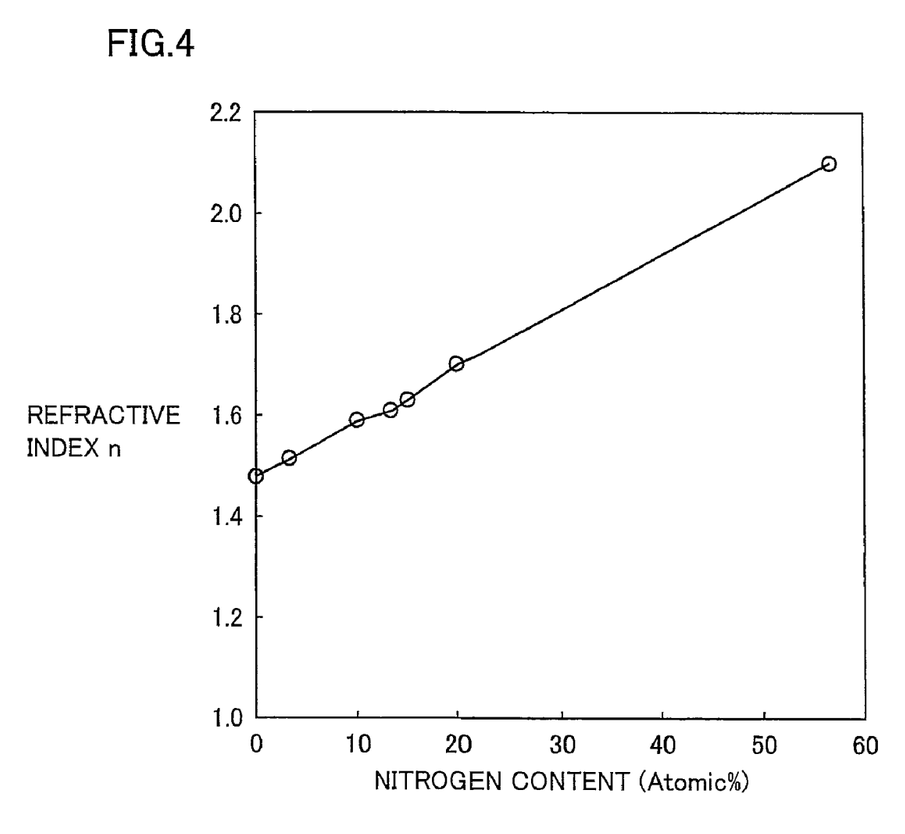
FIG. 4 shows a relationship between a refractive index n and a nitrogen content (atomic %) of the coat film made of silicon oxynitride.

FIG. 4 shows a relationship between the refractive index n and a nitrogen content (atomic %) of coat film 26 made of silicon oxynitride. In FIG. 4, the horizontal axis represents the nitrogen content (atomic %) of coat film 26 made of silicon oxynitride, and the vertical axis represents the refractive index n of coat film 26. Note that in the present invention, the nitrogen content (atomic %) refers to a ratio (atomic %) of atomic % of nitride atoms to the total (100 atomic %) of atomic % of silicon atoms, atomic % of oxygen atoms and atomic % of nitride atoms in coat film 26 made of silicon oxynitride.

As shown in FIG. 4, the refractive index n of coat film 26 made of silicon oxynitride can be easily controlled by adjusting the nitrogen content (atomic %). Accordingly, it is possible in the present invention to easily and stably obtain coat film 26 with a reflectance for feedback light of laser light of 0.5% or less.

In the present invention, as shown in FIG. 3, by setting a refractive index of coat film 26 of 1.54 or more and 1.64 or less, a reflectance (reflectance of coat film 26 to a beam of laser light (feedback light) having a wavelength of 405 nm) of 0.1% or less can be achieved. This reflectance cannot be achieved by a coat film produced by using silicon oxide or aluminum oxide.

Figure 5:
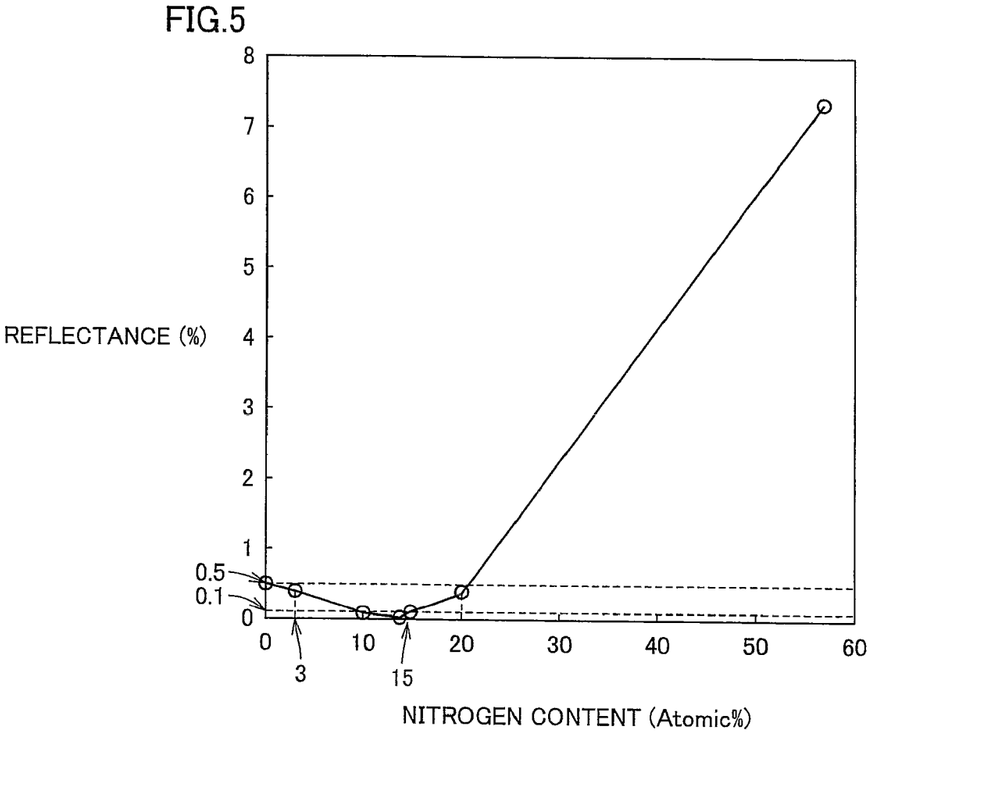
FIG. 5 shows a relationship between the nitrogen content (atomic %) and a reflectance (%) of the coat film made of silicon oxynitride.

FIG. 5 shows a relationship between the nitrogen content (atomic %) and the reflectance (%) of a coat film made of silicon oxynitride. The horizontal axis represents the nitrogen content (atomic %) of coat film 26 made of silicon oxynitride, and the vertical axis represents reflectance (%) of coat film 26. Note that the reflectance shown in FIG. 5 is a reflectance of coat film 26 to a laser beam having a wavelength of 405 nm when the thickness of coat film 26 is set to 405/4/n. Note also that the relationship shown in FIG. 5 is derived from the relationships of FIG. 3 and FIG. 4.

As shown in FIG. 5, it is found that when the nitrogen content (atomic %) in coat film 26 made of silicon oxynitride is 3 atomic % or more and 20 atomic % or less, the reflectance of coat film 26 to a laser beam having a wavelength of 405 nm is 0.5% or less. It is also found that when the nitrogen content (atomic %) in coat film 26 made of silicon oxynitride is 10 atomic % or more and 15 atomic % or less, the reflectance of coat film 26 to a laser beam having a wavelength of 405 nm is 0.1% or less.

As described above, in the present invention, silicon oxynitride is used for a material of coat film 26 formed on cavity end face 25 on the light emission side of nitride semiconductor laser element 100, and the nitrogen content (atomic %) in coat film 26 is 3 atomic % or more and 20 atomic % or less, enabling the reflectance of coat film 26 to a laser beam having a wavelength of 405 nm to be easily and stably reduced to 0.5% or less. Also, the nitrogen content (atomic %) in coat film 26 is 10 atomic % or more and 15 atomic % or less, enabling the reflectance of coat film 26 to a laser beam having a wavelength of 405 nm to be easily and stably reduced to 0.1% or less.

Accordingly, in the present invention, coat film 26 having a low reflectance such that the reflectance of coat film 26 to feedback light of laser light is 0.5% or less, and preferably 0.1% or less, can be easily and stably formed. A nitride semiconductor laser element suitable for a light source of an ECL device can therefore be manufactured with high yields.

In the above, description has been given assuming that a laser beam having a wavelength of 405 nm is feedback light. The same argument holds good when a laser beam having a wavelength within the range from 400 nm (inclusive) to 420 nm (inclusive) is feedback light. That is, by setting the nitrogen content of coat film 26 made of silicon oxynitride in the range from 3 atomic % (inclusive) to 20 atomic % (inclusive), the reflectance of coat film 26 to feedback light having a wavelength of 400 nm or more and 420 nm or less can be reduced to 0.5% or less. By setting the nitrogen content of coat film 26 made of silicon oxynitride in the range from 10 atomic % (inclusive) to 15 atomic % (inclusive), the reflectance of coat film 26 to feedback light having a wavelength of 400 nm or more and 420 nm or less can be reduced to 0.1% or less.

Figure 6:
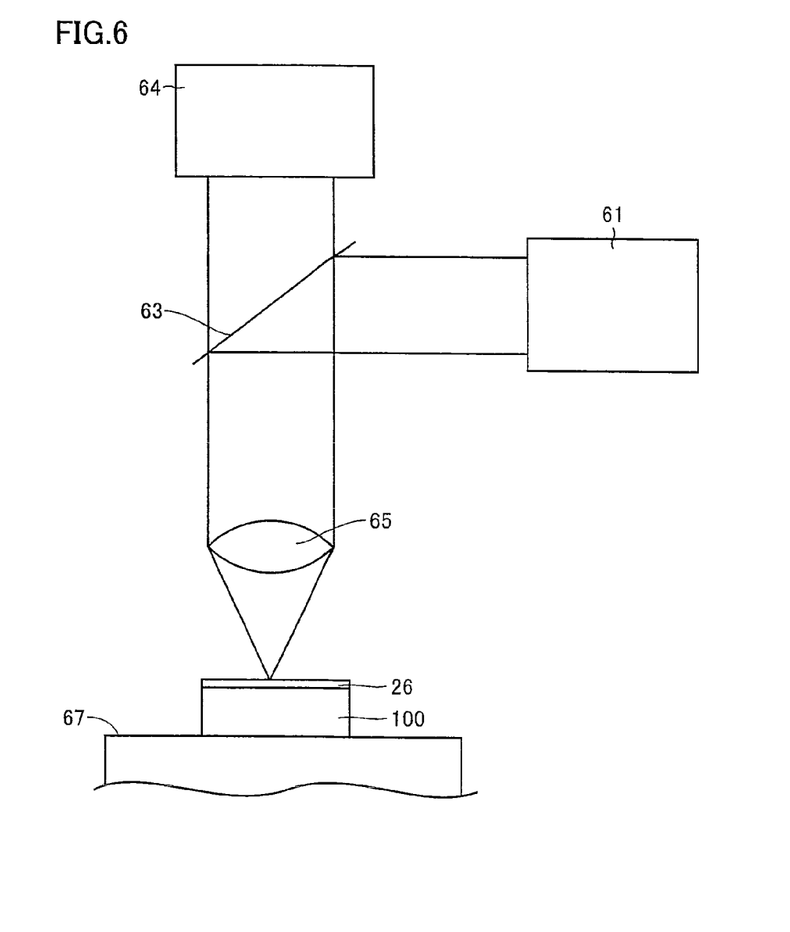
FIG. 6 shows a schematic configuration of an exemplary reflectance measurement device for measuring the reflectance of the coat film of the nitride semiconductor laser element of the present invention.

FIG. 6 shows a schematic configuration of an exemplary reflectance measurement device for measuring the reflectance of coat film 26 of nitride semiconductor laser element 100 in the present invention. Here, the reflectance measurement device has a white light source 61, a light intensity detector 64, a half mirror 63 for reflecting an incident beam from white light source 61 to a predetermined direction, an objective lens 65 for collecting an incident beam from white light source 61, and a stage 67 facing objective lens 65.

Using a reflectance measurement device having such a configuration, the reflectance of coat film 26 of nitride semiconductor laser element 100 is measured, for example, as follows. First, nitride semiconductor laser element 100 is placed on stage 67 of the reflectance measurement device such that coat film 26 on the light emission side faces objective lens 65.

Next, an incident beam is emitted from white light source 61, and the incident beam emitted from white light source 61 is reflected from half mirror 63 and thereafter passes through objective lens 65. Then, the incident beam is incident perpendicularly to the surface of coat film 26 of nitride semiconductor laser element 100.

Then, the incident beam that has been incident on the surface of coat film 26 of nitride semiconductor laser element 100 is reflected from the surface of coat film 26 to become a reflected beam. The reflected beam passes through objective lens 65 and half mirror 63 in sequence, and is incident on light intensity detector 64. For the reflected beam that has been incident on light intensity detector 64, its intensity is measured in light intensity detector 64.

From the intensity of the reflected beam measured as mentioned above, the reflectance (%) of coat film 26 is calculated from the following equation (1).

Reflectance (%) of coat film 26=(intensity of a reflected beam from coat film 26)×(reflectance (%) of a reference)/(intensity of a reflected beam of the reference)  (1)

Note that as the reference, a component with a known reflectance and a known intensity of a reflected beam can be used without particular limitations. For example, an aluminum (Al) mirror or the like may be used.

As white light source 61, for example, a deuterium lamp, a halogen lamp, a xenon lamp and the like may be each used singly, or a plurality of kinds thereof may be used in combination.

As objective lens 65, for example, use of a reflection objective lens can prevent effects of a reflected beam from an end face on the light reflection side of nitride semiconductor laser element 100. Note that from a viewpoint of preventing effects of the reflected beam from the end face on the light reflection side, it is preferable that the reflectance of high reflection film 24 on the light reflection side be reduced in advance when the reflectance of coat film 26 on the light emission side is measured.

Note that as high reflection film 24 formed on the surface of cavity end face 23 on the light reflection side shown in FIG. 2, for example, a film that is formed of a single layer made, for example, of silicon oxide ($SiO_2$), titanium oxide ($TiO_2$), silicon nitride (SiN) or aluminum oxide ($Al_2O_3$) may be used, or a film that is formed by stacking a plurality of layers of these materials may be used.

Figure 7:
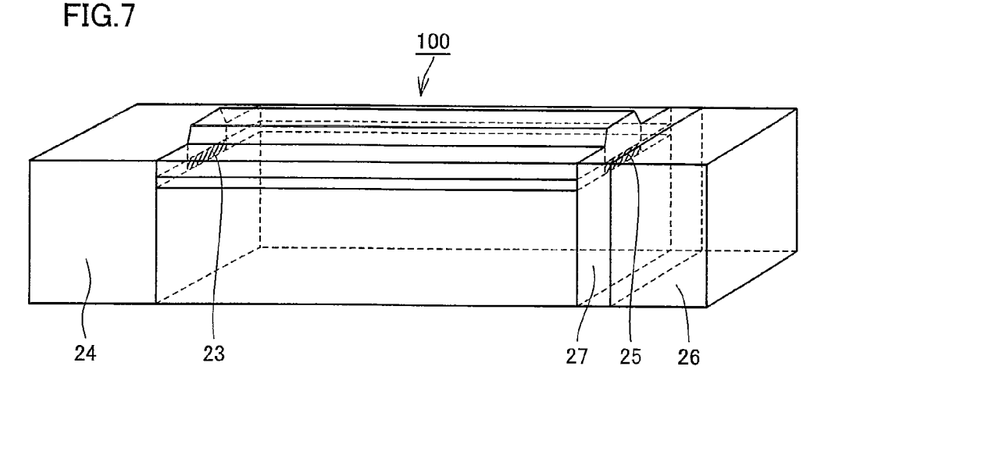
FIG. 7 is a schematic perspective view of a nitride semiconductor laser element in accordance with another embodiment of the present invention.

FIG. 7 is a schematic perspective view of a nitride semiconductor laser element in accordance with another embodiment of the present invention. Here, nitride semiconductor laser element 100 in a configuration shown in FIG. 7 is featured in that an interlayer 27 made of aluminum oxynitride is formed on the surface of cavity end face 25 on the light emission side serving as the main surface of emission of a beam of laser light, and coat film 26 made of silicon oxynitride is formed on the surface of interlayer 27.

Also in nitride semiconductor laser element 100 in the configuration shown in FIG. 7, setting the nitrogen content of coat film 26 made of silicon oxynitride to 3 atomic % or more and 20 atomic % or less enables the reflectance of coat film 26 to a beam of laser light (feedback light) having a wavelength of 400 nm or more and 420 nm or less to be reduced to 0.5% or less. Setting the nitrogen content of coat film 26 made of silicon oxynitride to 10 atomic % or more and 15 atomic % or less enables the reflectance of coat film 26 to a beam of laser light (feedback light) having a wavelength of 400 nm or more and 420 nm or less to be reduced to 0.1% or less.

In nitride semiconductor laser element 100 in the configuration shown in FIG. 7, the oxygen content (atomic %) in interlayer 27 made of aluminum oxynitride is preferably 5 atomic % or more and 35 atomic % or less, and more preferably 5 atomic % or more and 30 atomic % or less. When the oxygen content (atomic %) in interlayer 27 made of aluminum oxynitride is 5 atomic % or more and 35 atomic % or less, and particularly 5 atomic % or more and 30 atomic % or less, the maximum output of nitride semiconductor laser element 100 tends to be high. Note that in the present invention, the oxygen content (atomic %) in interlayer 27 made of aluminum oxynitride refers to a ratio (atomic %) of atomic % of oxygen atoms to the total (100 atomic %) of atomic % of aluminum atoms, atomic % of oxygen atoms and atomic % of nitride atoms in interlayer 27 made of aluminum oxynitride.

An exemplary manufacturing method of nitride semiconductor laser element 100 is a configuration shown in FIG. 2 or FIG. 7 will be described below.

First, on the surface of disk-shaped conductive substrate 11, n-type nitride semiconductor buffer layer 12, n-type nitride semiconductor clad layer 13, n-type nitride semiconductor guide layer 14, nitride semiconductor active layer 15, p-type nitride semiconductor guide layer 16, p-type nitride semiconductor clad layer 17 and p-type nitride semiconductor contact layer 18 are epitaxially grown in this order from the side of conductive substrate 11, for example, by an MOCVD (Metal Organic Chemical Vapor Deposition) method or the like to form a wafer.

Next, part of p-type nitride semiconductor clad layer 17 and part of p-type nitride semiconductor contact layer 18 are etched and the like in a stripe shape to form ridge stripe portion 19. Insulting films 20 are formed on both sides of ridge stripe portion 19, and p electrode 21 is formed on the front surface of p-type nitride semiconductor contact layer 18. N-electrode 22 is formed on the back surface of conductive substrate 11.

Subsequently, the wafer after formation of n-electrode 22 is cleaved in a direction perpendicular to an extending direction of ridge stripe portion 19 to produce a laser bar in a bar shape. At this point, cleaved surfaces on both ends of the laser bar become cavity end face 25 on the light emission side and cavity end face 23 on the light reflection side, respectively.

Then, high reflection film 24 is formed on the surface of cavity end face 23 on the light reflection side of the laser bar, and coat film 26 made of silicon oxynitride is formed on the surface of cavity end face 25 on the light emission side (in the case of manufacturing nitride semiconductor laser element 100 in the configuration shown in FIG. 7, interlayer 27 is formed and thereafter coat film 26 is formed). Here, high reflection film 24, coat film 26 and interlayer 27 each can be formed, for example, by an ECR (Electron Cyclotron Resonance) sputtering method or MBE (Molecular Beam Epitaxy) method.

Thereafter, the laser bar after formation of coat film 26 is cut and divided in a direction parallel to the extending direction of ridge stripe portion 19, thereby obtaining nitride semiconductor laser element 100 in a configuration shown in FIG. 2 or FIG. 7.

Nitride semiconductor laser element 100 obtained as described above may be, for example, bonded to a submount and a stem by soldering, and thereafter be wire bonded and sealed with a cap seal.

Figure 8:
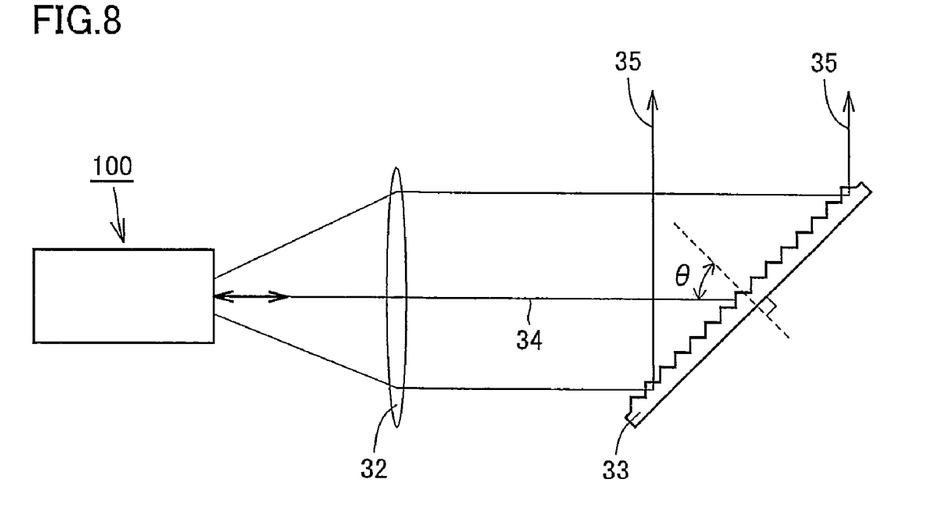
FIG. 8 shows a schematic configuration of an exemplary ECL device using a nitride semiconductor laser element of the present invention.

FIG. 8 shows a schematic configuration of an exemplary ECL device using nitride semiconductor laser element 100 of the present invention. Here, the ECL device has nitride semiconductor laser element 100, a collimate lens 32 and a diffraction grating 33.

A laser beam emitted from nitride semiconductor laser element 100 serving as a light source passes through collimate lens 32 and is incident on diffraction grating 33. Diffraction grating 33 has a rotary mechanism, and therefore the laser beam having a wavelength specified according to an angle θ at which the laser beam is incident on diffraction grating 33 is output as a first-order diffracted beam 34.

First-order diffracted beam 34 passes through collimate lens 32 and, as feedback light, is incident on nitride semiconductor laser element 100. The feedback light being incident on nitride semiconductor laser element 100 causes nitride semiconductor laser element 100 to emit a single longitudinal mode laser beam. The wavelength of the single longitudinal mode laser beam becomes equal to the wavelength of first-order diffracted beam 34 that has been incident as feedback light. Accordingly, diffraction grating 33 is rotated to change the wavelength of first-order diffracted beam 34, so that the wavelength of the single longitudinal mode laser beam emitted from nitride semiconductor laser element 100 can be changed. Finally, a zero-order diffracted beam is an output beam of the ECL device, and its wavelength is single.

Characteristics required of the ECL device is to emit an output beam that is a large output and is excellent in single longitudinal mode characteristic. In the present invention, nitride semiconductor laser element 100 having low-reflectance coat film 26 made of silicon oxynitride having a reflectance of 0.5% or less, and preferably 0.1% or less, for a beam of laser light (feedback light) having a wavelength of 400 nm or more and 420 nm or less formed on cavity end face 25 on the light emission side is used as a light source of an ECL device, and therefore, an output beam that is a large output and is excellent in single longitudinal mode characteristic can be achieved.

EXAMPLES

Example 1

Nitride semiconductor laser element 100 of Example 1 of the present invention has the same multilayer structure as that shown in FIG. 1. On conductive substrate 11 made of n-type GaN, 200-nm thick n-type nitride semiconductor buffer layer 12 made of Si-doped n-type GaN, 2.5-μm thick n-type nitride semiconductor clad layer 13 made of Si-doped n-type $Al_{0.06}Ga_{0.94}N$ and 100-nm n-type nitride semiconductor guide layer 14 made of Si-doped n-type GaN are sequentially stacked.

Nitride semiconductor active layer 15 is stacked on n-type nitride semiconductor guide layer 14. Here, nitride semiconductor active layer 15 is structured such that the first 25-nm thick barrier layer made of non-doped $In_{0.02}Ga_{0.98}N$, a triple quantum wells in which three periods of two-layer stacked bodies each including a 4-nm thick well layer made of non-doped $In_{0.06}Ga_{0.94}N$ and a 8-nm thick barrier layer made of non-doped $In_{0.02}Ga_{0.98}N$ are stacked, the final 25-nm thick barrier layer made of non-doped $In_{0.02}Ga_{0.98}N$, a 50-nm thick non-doped GaN layer and a 50-nm thick Mg-doped p-type $Al_{0.3}Ga_{0.7}N$ layer are stacked in this order from the side of n-type nitride semiconductor guide layer 14.

Structured on nitride semiconductor active layer 15 are 100-nm thick p-type nitride semiconductor guide layer 16 made of Mg-doped p-type GaN, 550-nm thick p-type nitride semiconductor clad layer 17 made of Mg-doped p-type $Al_{0.06}Ga_{0.94}N$ and p-type nitride semiconductor contact layer 18 made of Mg-doped p-type GaN stacked in this order from the side of nitride semiconductor active layer 15.

Ridge stripe portion 19 is formed by etching part of p-type nitride semiconductor clad layer 17 and part of p-type nitride semiconductor contact layer 18 in a stripe shape, and its width is 1.4 μm.

Formed on both sides of ridge stripe portion 19 are insulating films 20 so as to prevent current from being injected into portions other than ridge stripe portion 19. Insulating films 20 each include a silicon oxide ($SiO_2$) film having a thickness of 150 nm and a titanium oxide ($TiO_2$) having a thickness of 50 nm.

P-electrode 21 for injecting current into ridge stripe portion 19 is structured such that a Pd film, an Mo film and an Au film are stacked in this order from the side of ridge stripe portion 19. Formed on the back surface of conductive substrate 11 made of n-type GaN is n-electrode 22 structured such that an Hf film, an Al film, an Mo film, a Pt film and an Au film are stacked in this order from the side of ridge stripe portion 19.

Films having the same respective configurations as those of the films shown in FIG. 2 are formed on cavity end faces of nitride semiconductor laser element 100 of Example 1 of the present invention having the above-mentioned stacked layer structure. Here, coat film 26 made of silicon oxynitride is formed on cavity end face 25 on the light emission side; the nitrogen content in coat film 26 was 10 atomic %, its thickness was 67 nm, and its refractive index was 1.59.

Coat film 26 was formed by an ECR sputtering method; regarding the film formation conditions, the target was silicon, the gas flow rate of argon gas was 20 sccm, the gas flow rate of nitride gas was 4.5 sccm, the gas flow rate of oxygen gas was 2 sccm, RF power was 500 W, and microwave power was 500 W. The nitrogen content in coat film 26 was measured by an AES (Auger Electron Spectroscopy). Here, the nitrogen content was calculated as a ratio (atomic %) of atomic % of nitride atoms to the total (100 atomic %) of atomic % of silicon atoms, atomic % of oxygen atoms and atomic % of nitride atoms.

High reflection film 24, which is a multilayer film of silicon oxide ($SiO_2$) and titanium oxide ($TiO_2$), is formed on cavity end face 23 on the light reflection side. The reflectance of reflection film 24 to a laser beam having a wavelength of 405 nm emitted from a light emitting portion of nitride semiconductor laser element 100 of Example 1 of the present invention is set to 95%.

For measurement of the reflectance of coat film 26, white light was incident from the upper side of coat film 26 using a reflective film thickness monitor, FE-3000 (made by Otsuka Electronics Co., Ltd.), and the intensity of the reflected beam was measured. The reflectance was calculated from the aforementioned equation (1). Here, an aluminum mirror was used as a reference. As a result, the reflectance of coat film 26 to a laser beam having a wavelength of 405 nm was 0.1%.

Note that the cavity length of nitride semiconductor laser element 100 of Example 1 of the present invention was 800 μm, and its width (length in a direction perpendicular to the cavity length) was 200 μm.

When characteristics of nitride semiconductor laser element 100 of Example 1 of the present invention in the above configuration were measured at room temperature, it was confirmed that a laser beam was emitted without breakage of the element at an output up to 200 mW with a threshold current value of 48 mA. Further, when a continuous driving test was carried out under a condition of an output of 60 mW in an atmosphere of 80° C., it was confirmed that the element continued to drive for 1000 hours without failure.

When nitride semiconductor laser element 100 of Example 1 of the present invention in the foregoing configuration was used for a light source of an ECL device in the configuration shown in FIG. 8, it was confirmed that a single longitudinal mode laser beam was emitted at an output up to 40 mW.

On the other hand, as a comparative example, an ECL device in the configuration shown in FIG. 8 using, as a light source, a nitride semiconductor laser element having the same configuration as that in Example 1 of the present invention except for forming a coat film made of $Al_2O_3$ having a reflectance of 1.2%, instead of coat film 26, on the cavity end face on the light emission side was produced. When characteristics of the ECL device of this comparative example were evaluated, it was confirmed that a single longitudinal mode laser beam was emitted at an output up to 20 mW, resulting in a laser beam of a plurality of longitudinal modes at an output of 20 mW or more. It is considered that this is because a reflectance of 1.2% of the coat film formed on the cavity end face on the light emission side of nitride semiconductor laser element serving as a light source of the ECL device in this comparative example is not sufficiently low.

Thus, with a nitride semiconductor laser element of the present invention that can reduce the reflectance of a coat film formed on the cavity end face on the light emission side to 0.1% or less, a single longitudinal mode laser beam can be obtained at a larger output, and therefore this element is useful for a light source of an ECL device.

Example 2

A nitride semiconductor laser element of Example 2 of the present invention has the same configuration as that of nitride semiconductor laser element 100 of Example 1 of the present invention except that interlayer 27 made of aluminum oxynitride is formed between coat film 26 and cavity end face 25 on the light emission side as shown in FIG. 7.

Here, the nitrogen content in coat film 26 was 10 atomic %, its thickness was 54 nm, and its refractive index was 1.59. The oxygen content of interlayer 27 was 15%, its thickness was 20 nm, and its refractive index was 1.90.

Coat film 26 was formed by an ECR sputtering method, and the film formation conditions were the same as those of Example 1. The nitrogen content in coat film 26 was measured by an AES in the same way as in Example 1. The nitrogen content was calculated as a ratio (atomic %) of atomic % of nitride atoms to the total (100 atomic %) of atomic % of silicon atoms, atomic % of oxygen atoms and atomic % of nitride atoms.

Interlayer 27 was also formed by an ECR sputtering method; regarding the film formation conditions, the target was aluminum, the gas flow rate of argon gas was 20 sccm, the gas flow rate of nitride gas was 5.5 sccm, the gas flow rate of oxygen gas was 0.4 sccm, RF power was 500 W, and microwave power was 500 W. The oxygen content in interlayer 27 was also measured by an AES. Here, the oxygen content was calculated as a ratio (atomic %) of atomic % of oxygen atoms to the total (100 atomic %) of atomic % of aluminum atoms, atomic % of oxygen atoms and atomic % of nitride atoms.

When the reflectance of a stacked-layer film composed of interlayer 27 and coat film 26 on the light emission side of nitride semiconductor laser element in Example 2 of the present invention was measured in the same way as in Example 1, the reflectance of this film to a laser beam having a wavelength of 405 nm emitted from the light emitting portion of nitride semiconductor laser element 100 in Example 2 of the present invention was 0.5%.

When characteristics of nitride semiconductor laser element 100 of Example 2 of the present invention in the above configuration were measured at room temperature, it was confirmed that a laser beam was emitted without breakage of the element at an output up to 400 mW with a threshold current value of 50 mA. Further, when a continuous driving test was carried out under a condition of an output of 60 mW in an atmosphere of 80° C., it was confirmed that the element continued to drive for 1000 hours without failure.

When nitride semiconductor laser element 100 of Example 2 of the present invention was used for a light source of an ECL device in the configuration shown in FIG. 8 in the same way as in Example 1, it was confirmed that a single longitudinal mode laser beam was emitted at an output up to 30 mW.

As in Example 2, use of interlayer 27 made of aluminum oxynitride enables the maximum output of a nitride semiconductor laser element to be increased. However, in the case of use of interlayer 27 made of aluminum oxynitride, the reflectance that can be realized becomes larger compared to the case without use of interlayer 27. Nonetheless, as shown in the present example, when the reflectance on the light emission side is set to 0.5% or less, an ECL device emitting a single longitudinal mode laser beam at a large output can be obtained.

Reduction of the reflectance that can be realized is made possible by decreasing the thickness of interlayer 27 made of aluminum oxynitride from 20 nm in this example, or increasing the oxygen content from 15% in this example. However, if the thickness of interlayer 27 is decreased, or if the oxygen content is increased, an effect of increasing the maximum output of nitride semiconductor laser element 100 as a function of interlayer 27 made of aluminum oxynitride is lowered. It is therefore preferable that the thickness and oxygen content of interlayer 27 be adjusted as far as no problem occurs about the maximum output.

In view of the foregoing circumstances, the oxygen content of interlayer 27 made of aluminum oxynitride is preferably 35 atomic % or less, and more preferably 30 atomic % or less. Here, the oxygen content refers to a ratio (atomic %) of atomic % of oxygen atoms to the total (100 atomic %) of atomic % of aluminum atoms, atomic % of oxygen atoms and atomic % of nitride atoms in the same manner as mentioned above.

A nitride semiconductor laser element and an ECL device of the present invention can be used for optical disc applications, such as holographic memories, light communication systems, electronic information devices, lighting systems and the like.

Although the present invention has been described and illustrated in detail, it is clearly understood that the same is by way of illustration and example only and is not to be taken by way of limitation, the scope of the present invention being interpreted by the terms of the appended claims.

What is claimed is:

1. A nitride semiconductor laser element comprising a light emitting portion made of a nitride semiconductor,
wherein a coat film made of silicon oxynitride is formed on said light emitting portion, said coat film having a nitrogen content ranging from 3 to 20 atomic % and having a refractive index of 1.54 or more to 1.64 or less,
wherein an interlayer made of aluminum oxynitride is formed in contact with said light emitting portion, between said light emitting portion and said coat film, and
wherein a reflectance of said coat film to feedback light of laser light emitted from said light emitting portion is 0.5% or less.

2. The nitride semiconductor laser element according to claim 1, wherein an oxygen content in said interlayer ranges from 5 to 35 atomic %.

3. The nitride semiconductor laser element according to claim 1, wherein said reflectance is 0.1% or less.

4. The nitride semiconductor laser element according to claim 3, wherein a nitrogen content in said coat film ranges from 10 to 15 atomic %.

5. The nitride semiconductor laser element according to claim 1, wherein a wavelength of said feedback light ranges from 400 nm to 420 nm.

6. An external-cavity semiconductor laser device comprising:
the nitride semiconductor laser element according to claim 1; and
a diffraction grating for returning at least part of the laser light emitted from said nitride semiconductor laser element to said nitride semiconductor laser element.

* * * * *